(12) United States Patent
Granik et al.

(10) Patent No.: US 7,392,168 B2
(45) Date of Patent: Jun. 24, 2008

(54) METHOD OF COMPENSATING FOR ETCH EFFECTS IN PHOTOLITHOGRAPHIC PROCESSING

(76) Inventors: Yuri Granik, 554 Driscoll Pl., Palo Alto, CA (US) 94306; Franklin M. Schellenberg, 4023 Villa Vista, Palo Alto, CA (US) 94306

(*) Notice: Subject to any disclaimer, the term of this patent is extended or adjusted under 35 U.S.C. 154(b) by 983 days.

(21) Appl. No.: 09/898,431

(22) Filed: Jul. 2, 2001

(65) Prior Publication Data
US 2002/0133801 A1 Sep. 19, 2002

Related U.S. Application Data

(60) Provisional application No. 60/275,673, filed on Mar. 13, 2001.

(51) Int. Cl.
G06F 17/50 (2006.01)
G06F 13/12 (2006.01)

(52) U.S. Cl. .................... 703/13; 716/4; 716/8; 716/13; 716/19; 716/21; 703/14; 703/15; 703/16; 703/20

(58) Field of Classification Search .............. 703/13, 703/14, 15, 16, 20; 716/4, 8, 13, 19, 21
See application file for complete search history.

(56) References Cited

U.S. PATENT DOCUMENTS

| | | | |
|---|---|---|---|
| 5,682,323 A | 10/1997 | Pasch et al. | |
| 5,801,954 A | 9/1998 | Le et al. | |
| 6,415,421 B2 * | 7/2002 | Anderson et al. | 716/4 |
| 6,425,113 B1 * | 7/2002 | Anderson et al. | 716/5 |
| 6,425,117 B1 * | 7/2002 | Pasch et al. | 716/21 |
| 6,470,489 B1 * | 10/2002 | Chang et al. | 716/21 |
| 6,539,521 B1 * | 3/2003 | Pierrat et al. | 716/4 |
| 6,541,165 B1 * | 4/2003 | Pierrat | 430/5 |
| 6,544,699 B1 * | 4/2003 | Kim et al. | 430/30 |
| 6,571,383 B1 * | 5/2003 | Butt et al. | 716/19 |
| 6,584,609 B1 * | 6/2003 | Pierrat et al. | 716/19 |

(Continued)

FOREIGN PATENT DOCUMENTS

JP 62057216 A * 3/1987

OTHER PUBLICATIONS

Schellenberg-F.M., "Design for Manufactureing in the Semiconductor Industry: The Litho/Design Workshops". Jan. 1999. IEEE p. 111-119.*

(Continued)

*Primary Examiner*—Albert Decady
*Assistant Examiner*—Tom Stevens

(57) ABSTRACT

A computer system reads data corresponding to an IC layout target layer and performs an etch simulation on the target layer. Etch biases are calculated and the inverse of the etch biases are used to produce a new target layer. The new target layer is provided as an input to an optical process correction (OPC) loop that corrects the data for image/resist distortions until a simulation indicates that a pattern of objects created on a wafer matches the new target layer. In another embodiment of the invention, original IC layout data is provided to both the OPC loop and an etch simulation. Etch biases calculated by the etch simulation are used in the OPC loop in order to produce mask/reticle data that will be compensated for both optical and resist distortions as well as for etch distortions.

24 Claims, 2 Drawing Sheets

U.S. PATENT DOCUMENTS

| | | | |
|---|---|---|---|
| 6,634,018 B2 * | 10/2003 | Randall et al. | 716/19 |
| 6,643,616 B1 * | 11/2003 | Granik et al. | 703/13 |
| 6,704,695 B1 * | 3/2004 | Bula et al. | 703/6 |
| 6,862,726 B2 * | 3/2005 | Futatsuya et al. | 716/19 |
| 6,883,153 B2 * | 4/2005 | Jiang et al. | 716/6 |
| 6,918,105 B2 * | 7/2005 | Mayhew | 716/21 |
| 2002/0086218 A1 * | 7/2002 | Tejnil | 430/5 |

OTHER PUBLICATIONS

Granik-Y. Correction for Etch Proximity: New Models and Applications. Feb.-Mar. 2001. Mentor Graphics p. 98-112.*

Zaidi et al., "Interferometric Lithography Exposure Tool for 180-nm Structures" Precedings SPIE-The International Society for Optical Engineering, vol. 3048, p. 248-254.*

* cited by examiner

METHOD OF COMPENSATING FOR ETCH EFFECTS IN PHOTOLITHOGRAPHIC PROCESSING

RELATED APPLICATIONS

The present application is related to U.S. Provisional Application No. 60/275,673 filed Mar. 13, 2001, and claims the benefit of the filing date under 35 U.S.C. § 119.

FIELD OF THE INVENTION

The present invention relates to photolithographic processing, and in particular, to methods of compensating mask/reticle data for etch process distortions.

BACKGROUND OF THE INVENTION

As integrated circuit (IC) features become smaller, process distortions have a growing impact on pattern fidelity in manufacturing and, in turn, on device performance. Examples of process distortions include pattern-dependent line-width biasing, corner rounding, and line end shortening, all of which create patterns on a wafer that are different than patterns defined on a corresponding mask or reticle.

In recent years, optical process correction (OPC) techniques have been developed that compensate for distortions that occur in printing. Originally, OPC modifications could be a simple set of rules applied to bias or otherwise alter a layout. However, as patterns became more intricate and distortions more severe, model-based OPC techniques were developed.

In model-based OPC, a process model is developed to allow simulation of the processing effects, typically through making a set of convolution kernels. Such kernels are usually chosen to be an orthogonal set, with the relative magnitudes determined by a calibration procedure with empirically gathered data from the distorting process. The simulation consists of calculating a mathematical convolution of the layout pattern with the kernels. If the simulated image is significantly different from the target layer (i.e., original layout), edges corresponding to the out-of-spec patterns are moved and a new layout is generated. The new layout is then used as an input to the simulator to estimate how the revised layout will print. Once an image is formed with specified tolerances, OPC correction is achieved and the final layout is passed on to be fabricated as a mask or reticle. The mathematically based techniques for analyzing image distortions can also be applied to resist processing distortions.

Another processing distortion that affects a wafer is the etch effect, whereby the patterns that are etched on the surface of a wafer differ from a desired pattern. In principle, etched distortions could be corrected using the iterative techniques applied to imaging and resist distortions. However, in practice the results are often inaccurate. This is because the physical phenomena of etching, such as density-based microloading and certain etch shadowing effects are non-linear and not well described by the linear mathematics of convolution. Furthermore, most optical and resist effects occur over a relatively small distance, typically on the order of 1-1.5 microns. Etch effects are dictated by the physical properties of a plasma that is formed above the wafer and often have interaction diameters of 4-5 microns. Since the computation time of convolution increases with the area, an increase in diameter from 1 to 5 microns would increase the area and the associated computation time by a factor of 25. Alternatively, attempts have been made to add separate etch simulators as part of an OPC correction loop. However, etch simulators tend to be computationally intensive and the addition of an etch simulator within each pass of an OPC loop can make the OPC correction process impractical to implement.

Given these problems, there is a need for a method of correcting layout data for etch distortions in a manner that is not computationally impractical yet still produces accurate results.

SUMMARY OF THE INVENTION

A method of compensating layout data to be used in creating a mask or reticle for photolithographic process distortions and, in particular, etch process distortions. In one embodiment, the method includes the acts of reading a first set of mask/reticle data that defines a target layer to be created when a wafer is exposed through the mask/reticle. A simulation of the etch effects occurring on a wafer created using the first set of data is performed to determine etch biases or an estimate of the size of the objects that will be created on the wafer versus the size specified by the target layer. It should be noted that the simulation can be a traditional physics-based process simulation, but can also comprise a simpler model where predetermined values are accessed or produced by a set of rules or by accessing a look-up table. The inverse of the estimated etch biases are used to create a second set of mask/reticle data that defines a new target layer that is compensated for the etch distortion. A simulation of other optical process distortions is performed using the new target layer as an input. The mask/reticle data is then compensated for optical process distortions and the compensated set of data is then exported to a mask/reticle writer to manufacture a corresponding mask/reticle.

In another embodiment of the invention, an etch simulation is performed using a first set of mask/reticle data in order to calculate estimated etch biases. The etch biases are then inserted into an optical process correction (OPC) loop, wherein the etch biases are added/subtracted from the modified mask/reticle data upon each iteration of the OPC loop.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

As indicated above, the present invention is a method for compensating mask/reticle data for process distortions that occur on a wafer during photolithographic processing and particularly during etch processing.

Figure 1:
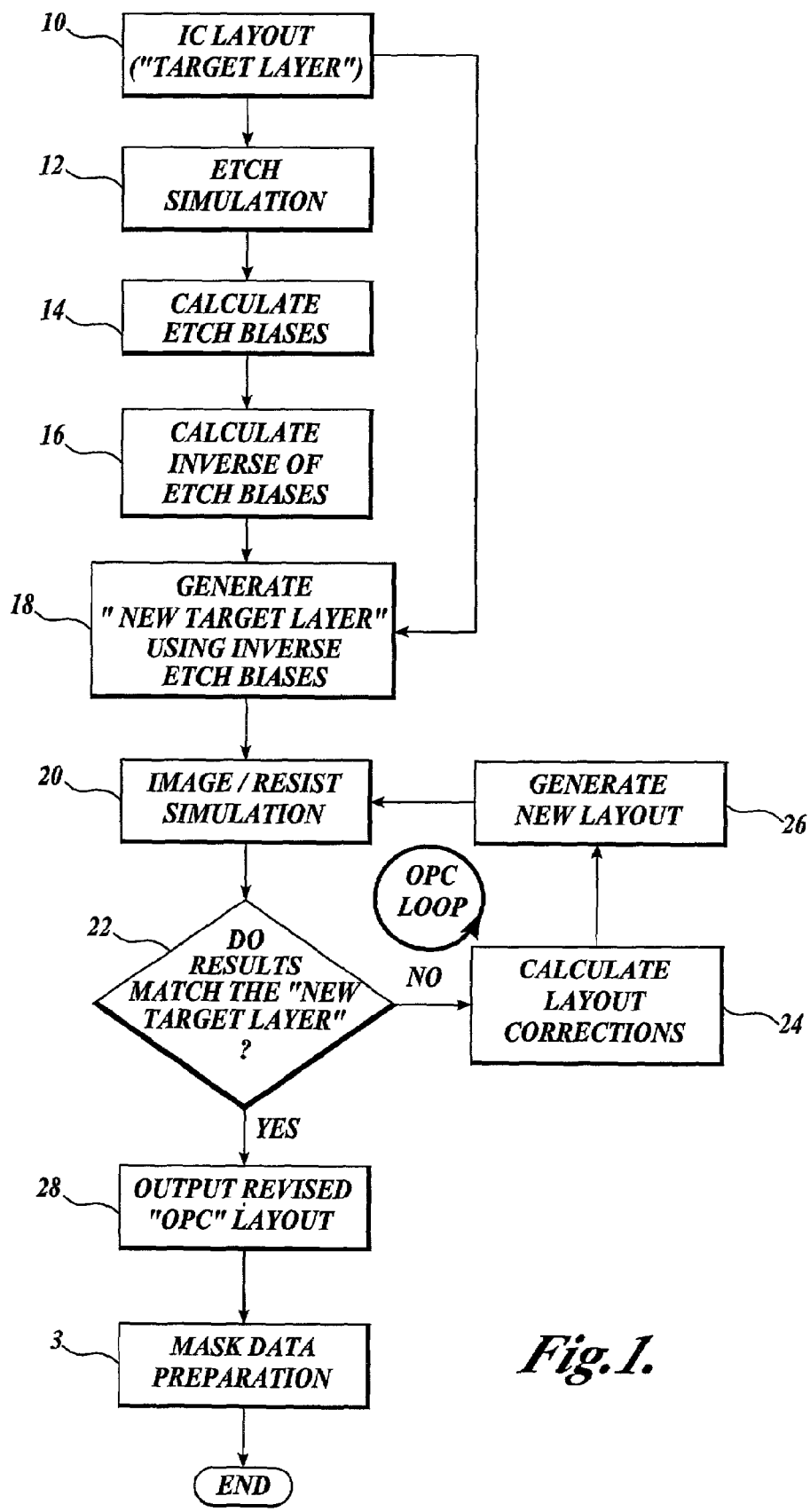
FIG. 1 is a flow chart showing the steps performed by one embodiment of a method of compensating mask/reticle data for process distortions in accordance with the present invention.

In accordance with one embodiment of the present invention, and as shown in FIG. 1, a computer system of the type including one or more processors (not shown), executes a sequence of program steps stored on a computer-readable media to cause the computer to read an IC layout or data file at a step 10 that defines a number of features to be placed on a mask/reticle. These features will define corresponding objects on a wafer when the wafer is exposed using the mask/reticle. The mask/reticle data can be referred to as a "target layer" when it defines the desired size/shape of the objects to be created on the wafer after processing. At a step 12, an etch simulation is performed that determines the likely effects of how the size or shape of the objects created on the wafer will differ from those defined in the target layer as a result of etching process distortions. This simulation may be a full physics based process simulation, or a simpler model comprising accessing a set of predetermined rules or using a look-up table. At a step 14, etch biases are calculated. For example, it may be determined that each object created on the wafer will be 10% smaller than the desired size of the object as specified by the target layer. The details of etch biasing and simulations are considered well known to those of ordinary skill in the art of photolithographic processing.

At a step 16, the inverse of the etch biases is calculated. In the example above, if the features in the wafer are 10% smaller than their desired size, then an etch bias correction is created from the inverse etch bias, i.e., an increase in the size of the features on the mask/reticle by 10%.

At a step 18, a new target layer is created using the inverse etch biases. The new target layer is created by analyzing the original IC target layer, read at a step 10, and applying the inverse etch biases that are determined at the step 16 to produce a new data set corresponding to the features as they would need to be prior to the start of the etching process.

The new target layer is then applied as an input to a standard OPC loop, which corrects the data that defines the new target layer for image and resist distortions. Beginning with a step 20, an image/resist simulation is performed. The image simulations may also include simulations of effects caused by mask/reticle fabrication as well. As with the etch simulation, the particular image/resist simulation performed is not considered crucial to the implementation of the invention. Image/resist simulations are well known to those of ordinary skill in the art.

At a step 22, a determination is made whether the results of the image/resist simulation match the new target layer. If not, new layout calculations are made at a step 24 and a new layout, including new or modified features, is generated at a step 26. Processing then returns to step 20 and another image/resist simulation is performed using the revised layout as an input. The process of the OPC loop repeats itself until the answer to step 22 is yes, and the results of the simulation match the new target layer that was supplied at step 18.

At a step 28, the revised, OPC corrected, layout data is output to a mask/reticle writer and a corresponding mask/reticle is prepared at a step 30. This mask/reticle will now be corrected for both image/resist effects and etch effects.

Figure 2:
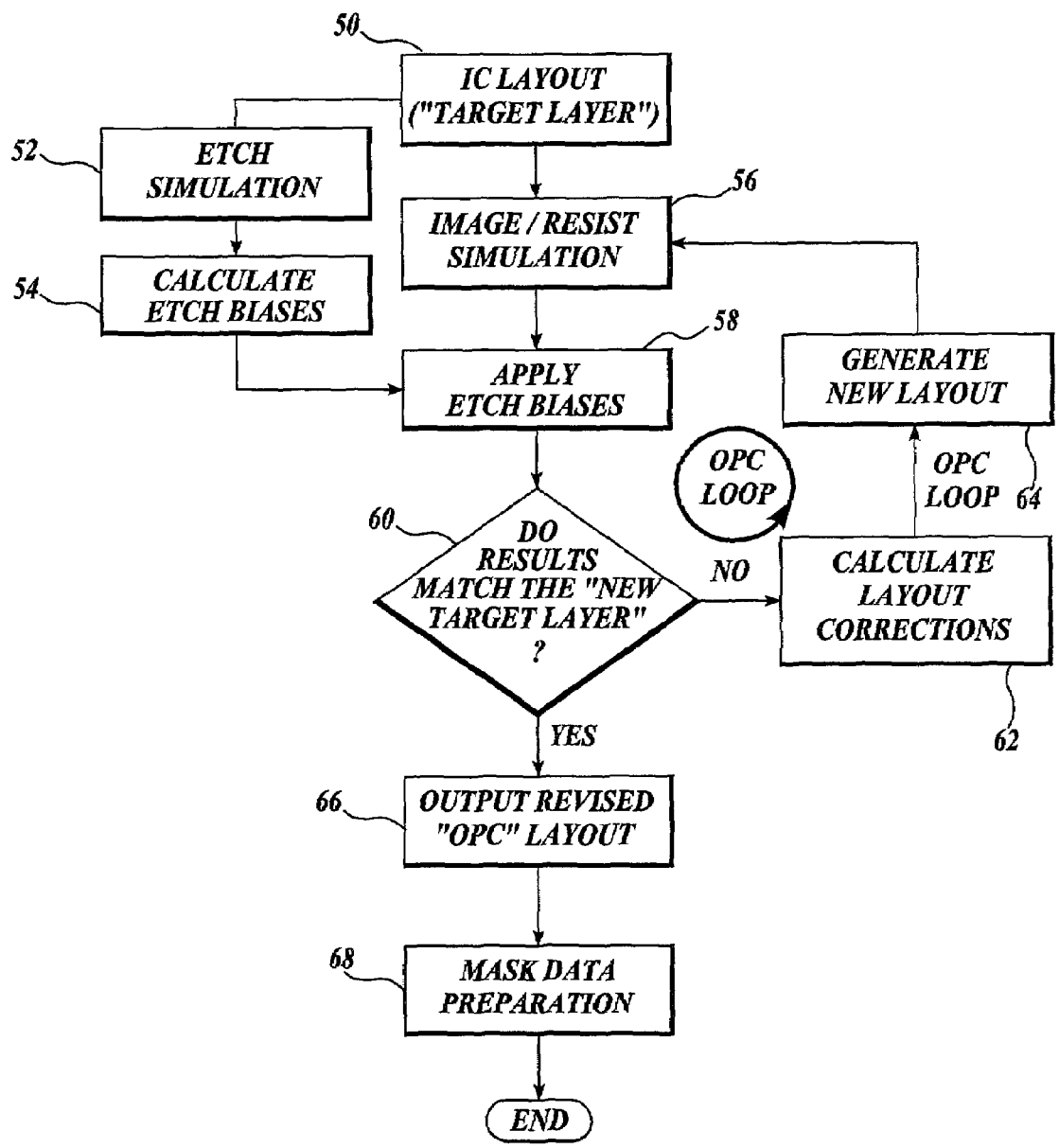
FIG. 2 illustrates a second embodiment of a method of compensating mask/reticle data for process distortions in accordance with the present invention.

FIG. 2 shows an alternative embodiment of a method for correcting mask/reticle data for process distortions in accordance with another aspect of the present invention. Beginning with a step 50, a data file that defines an IC layout target layer is read by the computer system. At a step 52, an etch simulation is performed that will calculate the likely distortions caused by the etching process on a wafer created with a mask/reticle as defined by the original target layer.

At a step 54, the etch biases are calculated that will predict how sizes or shapes of the objects created on the wafer will differ from their desired shapes or sizes as a result of the etching distortions.

As opposed to creating a new target layer using data that is compensated for etch distortions, the etch biases calculated at step 54 are applied as part of the OPC loop. The OPC loop begins at a step 56 wherein an image/resist simulation is performed on the original IC layout target layer that was read at step 50. The etch biases calculated at step 54 are then applied to the results of the image/resist simulation at step 58. This is more computationally efficient than including the entire etch simulation 52 within the computations of the OPC loop. At a step 60, a determination is made whether the results of the image/resist simulation, including the etch biases, match the target layer provided. If not, new layout calculations are determined at step 62 and a new layout is generated at step 64. The process continues by returning to step 56 and performing another image/resist simulation with the new layout until the answer to step 60 is yes. At a step 66, the revised OPC layout is provided to a mask/reticle writer and a mask or reticle is prepared at a step 68.

At the present time, it is believed that the steps illustrated in FIG. 1 will provide better results in creating a mask/reticle data set that is compensated for both optical/resist process distortions as well as for etch distortions. However, if the etch biases are small, then the steps shown in FIG. 2 may provide an accurate enough result to produce acceptable wafers.

In addition, it may be possible to apply the etch biases calculated in step 54 to the layout data after a "yes" result is achieved from step 60, instead of after step 56, of each iteration of the OPC loop.

As will be appreciated, the present invention provides a simple and straightforward method of compensating mask/reticle data for both optical process distortions and etch distortions in a computationally efficient manner in order to produce mask/reticles that will produce desired results on a wafer.

While the preferred embodiment of the invention has been illustrated and described, it will be appreciated that various changes can be made therein without departing from the scope of the invention. The scope of the invention is therefore to be determined by the following claims and equivalents thereto.

The embodiments of the invention in which an exclusive property or privilege is claimed are defined as follows:

1. A method of compensating mask/reticle data for lithographic process distortions, comprising the acts of:
    reading a set of mask/reticle data that defines at least one feature to be created lithographically;
    performing an etch simulation of etch effects that would occur if a wafer is exposed using a mask/reticle corresponding to the set of mask/reticle data and etched with an etch process;
    using results of the etch simulation to produce a revised set of mask/reticle data that are compensated for the etch effects; and
    performing optical process correction (OPC) to produce a set of OPC-corrected mask/reticle data that compensate for optical/resist process distortions using the revised set of mask/reticle data as a target layer for the OPC.

2. The method of claim 1, comprising an additional act of exporting the OPC-corrected set of mask/reticle data to a mask/reticle writer to manufacture a corresponding mask/reticle.

3. The method of claim 1, in which the act of performing the etch simulation includes accessing a set of predetermined rules for the etch process.

4. The method of claim 1, in which the act of performing the etch simulation includes accessing a table of predetermined values for the etch process.

5. The method of claim 1, wherein the etch simulation determines an increase in size of a feature that would be created on a wafer compared with a target feature size as a result of the etch process and a corresponding feature in the revised set of mask/reticle data is biased with a corresponding decrease in size.

6. The method of claim 1, wherein the etch simulation determines a decrease in size of a feature that would be created on a wafer compared with a target feature size as a result of the etch process and a corresponding feature in the revised set of mask/reticle data is biased with a corresponding increase in size.

7. A method of compensating mask/reticle data for lithographic process distortions, comprising the acts of:
reading an initial set of mask/reticle data that defines at least one feature to be created lithographically;
performing an etch simulation of etch effects that would occur if a wafer is exposed using a mask/reticle corresponding to the initial set of mask/reticle data and etched with an etch process;
calculating etch biases from results of the etch simulation; and
applying the etch biases that are calculated from the initial set of mask/reticle data within a model-based optical process correction (OPC) loop that adjusts the mask/reticle data for optical/resist process distortions.

8. The method of claim 7, in which the act of performing the etch simulation includes accessing a set of predetermined rules for the etch process.

9. The method of claim 7, in which the act of performing the etch simulation includes accessing a table of predetermined values for the etch process.

10. A computer-readable media having a sequence of programmed instructions stored thereon that when executed by a computer causes the computer to perform the acts of:
reading a set of mask/reticle data that defines at least one feature to be created lithographically;
performing an etch simulation of etch effects that would occur if a wafer is exposed using a mask/reticle corresponding to the set of mask/reticle data and etched with an etch process using the results of the etch simulation to produce a revised set of mask/reticle data that are compensated for the etch effects; and
performing optical process correction (OPC) to produce a set of OPC-corrected mask/reticle data that compensate for optical/resist process distortions using the revised set of mask/reticle data as a target layer for the OPC.

11. The computer-readable media of claim 10, wherein the sequence of programmed instructions causes the computer to export OPC corrected mask/reticle data to a mask/reticle writer to manufacture a corresponding mask/reticle.

12. The computer readable media of claim 10, in which the act of performing the etch simulation includes accessing a set of predetermined rules for the etch process.

13. The computer readable media of claim 10, in which the act of performing the etch simulation includes accessing a table of predetermined values for the etch process.

14. The computer readable media of claim 10, wherein the instructions further cause the computer to determine an increase in size of a feature that would be created on a wafer compared with a target feature size as a result of the etch process and a corresponding feature in the revised set of mask/reticle data is biased with a corresponding decrease in size.

15. The computer readable media of claim 10, wherein the instructions further cause the computer to determine a decrease in size of a feature that would be created on a wafer compared with a target feature size as a result of the etch process and a corresponding feature in the revised set of mask/reticle data is biased with a corresponding increase in size.

16. A computer readable media having a sequence of programmed instructions stored thereon that when executed by a computer causes the computer to perform the acts of:
reading an initial set of mask/reticle data that defines at least one feature to be created lithographically;
performing an etch simulation of etch effects that would occur if a wafer is exposed with a mask/reticle corresponding to the set of initial mask/reticle data and etched with an etch process;
calculating etch biases from results of the etch simulation; and
applying the etch biases that are calculated from the initial set of mask/reticle data in a model-based optical process correction (OPC) loop that adjusts the mask/reticle data for optical/resist process distortions.

17. The computer readable media of claim 16, in which the act of performing the etch simulation includes accessing a set of predetermined rules for the etch process.

18. The computer readable media of claim 16, in which the act of performing the etch simulation includes accessing a table of predetermined values for the etch process.

19. A device that is formed on a wafer created by the acts of:
reading a set of mask/reticle data that defines at least one feature to be created lithographically;
performing an etch simulation of etch effects that would occur if a wafer is exposed using a mask/reticle corresponding to the set of mask/reticle data and etched with an etch process;
using results of the etch simulation to produce a revised set of mask/reticle data that are compensated for the etch effects;
performing optical process correction (OPC) to produce OPC-corrected mask/reticle data that are compensated for optical/resist process distortions using the revised set of mask/reticle data as a target layer for the OPC;
exporting the OPC-corrected set of mask/reticle data to a mask/reticle writer to manufacture a corresponding mask/reticle; and
using the mask/reticle to create the device on the wafer.

20. The device of claim 19, in which the act of performing the etch simulation includes accessing a set of predetermined rules for the etch process.

21. The device of claim 19, in which the act of performing the etch simulation includes accessing a table of predetermined values for the etch process.

22. A device that is formed on a wafer created by the acts of:
reading an initial set of mask/reticle data that defines at least one feature to be created lithographically;
performing an etch simulation of etch effects that would occur if a wafer is exposed using a mask/reticle corresponding to the initial set of mask/reticle data and etched with an etch process;
calculating etch biases from results of the etch simulation;
applying the etch biases that are calculated from the initial set of mask/reticle data within a model-based optical process correction (OPC) loop that adjusts the mask/reticle data for optical/resist process distortions;
exporting the adjusted mask/reticle data to a mask/reticle writer to create a corresponding mask/reticle; and
using the mask/reticle to create the device on a wafer.

23. The device of claim 22, in which the act of performing the etch simulation includes accessing a set of predetermined rules for the etch process.

24. The device of claim 22, in which the act of performing the etch simulation includes accessing a table of predetermined values for the etch process.

* * * * *